July 28, 1964 M. COOPERMAN 3,142,770

TUNNEL DIODE CIRCUITS

Filed March 2, 1962 2 Sheets-Sheet 1

INVENTOR.
MICHAEL COOPERMAN
BY
Carl V. Olson
ATTORNEY

INVENTOR.
MICHAEL COOPERMAN
BY
Earl V. Olson
ATTORNEY

United States Patent Office 3,142,770

Patented July 28, 1964

3,142,770

TUNNEL DIODE CIRCUITS

Michael Cooperman, Haddonfield, N.J., assignor to Radio Corporation of America, a corporation of Delaware Filed Mar. 2, 1962, Ser. No. 177,002
9 Claims. (Cl. 307—88.5)

This invention relates to tunnel diode circuits, and particularly to bistable tunnel diode circuits adapted to assume one output level in response to an input set pulse, and to assume another output level in response to an input reset pulse. A tunnel diode is a two-terminal device having a current-voltage characteristic including a narrow high-current peak portion and a broad low-current valley portion. A bistable tunnel diode circuit includes bias and load means providing a load line superimposed on the tunnel diode characteristic to provide one stable operating point intersection on the positive-resistance side of the high-current peak portion, and another stable operating point intersection on the positive-resistance side of the low-current valley portion of the tunnel diode characteristic. The bistable tunnel diode remains at one stable operating point until switched to the other stable operating point by the application of an appropriate input signal.

If the load presented to the bistable tunnel diode is a linear resistive load, the load line superimposed on the tunnel diode characteristic is a straight line. It is known that a tunnel diode presented with a straight resistive load line is difficult to build and operate in practical apparatus because the tolerances required on the circuit elements, the bias sources, the input signal and the load are severe. The tolerances are less severe when the load on the tunnel diode includes a non-linear impedance means such as an appropriately biased tunnel rectifier. Such an improved circuit may have characteristics as illustrated in FIGURE 3 resulting from the tunnel diode being provided with a non-linear load which presents a very high impedance at a first stable operating point on the positive-resistance side of the high-current peak of the tunnel diode current-voltage characteristic, and which presents an intermediate impedance at a second stable operating point on the positive-resistance side (in the case of bistable operation) or on the negative-resistance side (in the case of monostable operation) of the low-current valley of the tunnel diode characteristic.

It is an object of this invention to provide an improved bistable tunnel diode circuit which is more easily and reliably reset than previously known circuits.

It is another object of this invention to provide an improved bistable tunnel diode circuit which is capable of operation at higher repetition rates than comparable prior art circuits.

It is a further object to provide an improved bistable tunnel diode circuit characterized by simplicity and by the ability to reliably provide outputs to a plurality of utilization circuits.

A circuit exemplary of the invention includes a tunnel diode having a current-voltage characteristic including a narrow high-current peak and a broad low-current valley. The tunnel diode is coupled to one or more utilization circuits through one or more respective tunnel rectifiers. The tunnel rectifiers and utilization circuits present a non-linear current-voltage load characteristic or load line to the tunnel diode which includes a low-current high-impedance portion. The tunnel diode and the tunnel rectifiers are poled and biased by current and voltage sources in such a way as to provide a first stable operating point intersection of the positive-resistance side of the current valley portion of the tunnel diode characteristic and the low-current high-impedance portion of the load characteristic, and to provide a second stable operating point intersection of the positive-resistance side of the current-peak portion of the tunnel diode characteristic and another portion of the load characteristic. According to a modification of the circuit described, the same mode of operation is accomplished by connecting an additional tunnel diode in such a way that the ned for the bias current source is eliminated. In both embodiments, the tunnel diode characteristic and the load characteristic are effective in a complementary fashion to reduce and equalize the current requirements of the input set and reset pulses.

These and other objects and aspects of the invention will be apparent to those skilled in the art from the following more detailed description taken in conjunction with the appended drawing, wherein.

Figure 1:
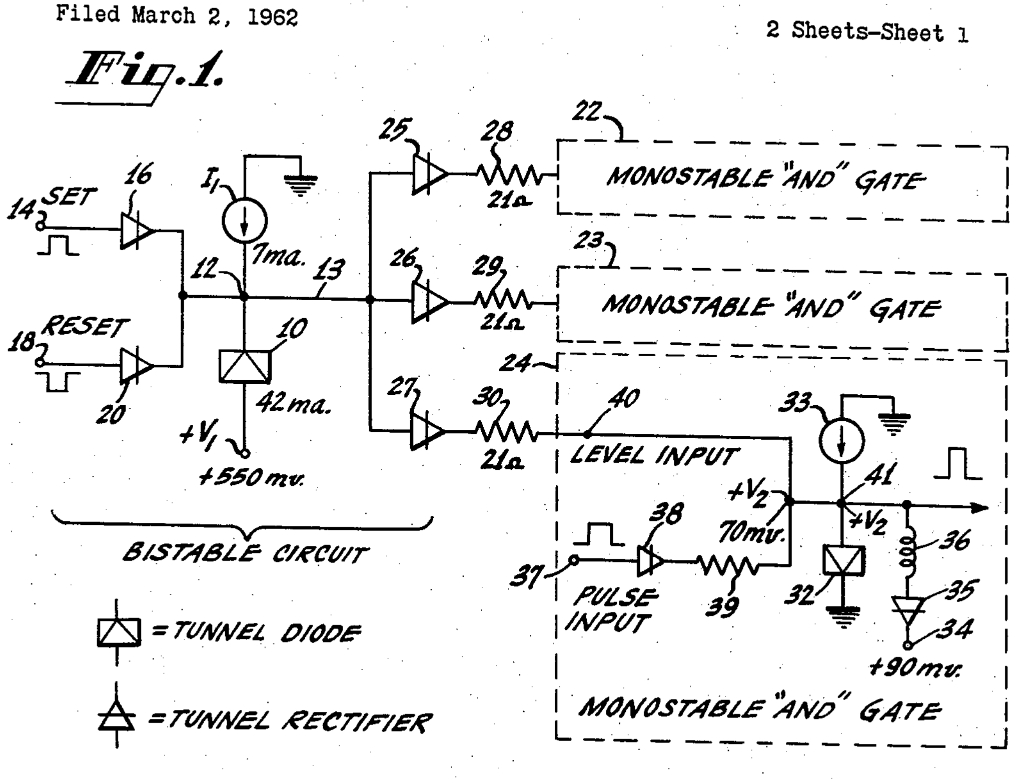
FIGURE 1 is a diagram of a bistable circuit, according to the invention, coupled to a plurality of utilization circuits.

Referring now in greater detail to FIGURE 1 of the drawing, a negative-resistance device or tunnel diode 10, which may be a germanium tunnel diode having a peak current of 42 milliamperes, is connected, biased and loaded for operation in a bistable manner. The anode of the tunnel diode is connected to the +V terminal of a constant voltage source which, in the present example, may provide a voltage of +550 millivolts. The cathode of the tunnel diode 10 is connected to a junction point 12 which is supplied with current from a constant current source $I_1$ providing a current, in the example, of 7 milliamperes. A positive set pulse applied to the set input terminal 14 is coupled in the forward direction through a tunnel rectifier 16 to the junction point 12. A negative reset pulse applied to the reset input terminal 18 is coupled in the reverse (breakdown) direction through a tunnel rectifier 20 to the junction point 12.

The junction point 12 is also coupled over lead 13 to three utilization circuits 22, 23 and 24, the coupling being made through respective non-linear impedance devices or tunnel rectifiers 25, 26 and 27 and respective impedances 28, 29 and 30. The impedances 28, 29 and 30 will inevitably include both inductance and resistance. When minimum operating delay is desired, the impedances should include the minimum possible amount of inductance. In other cases, it may be desirable for the impedances to be primarily inductive.

The utilization circuits 22, 23 and 24 may be monostable "and" gates, similar to each other, and like the one illustrated in box 24. The monostable circuit 24 includes a tunnel diode 32 biased by a current source 33, and the positive terminal 34 of a voltage source connected through a tunnel rectifier 35 and an inductor 36 to the anode of the tunnel diode 32. The monostable circuit has a pulse input terminal 37 connected through a tunnel rectifier 38 and an impedance 39 to the anode of the tunnel diode 32. The monostable circuit 24 also has a level input terminal 40 to which is applied the output level of the bistable circuit including the tunnel diode 10.

The positive set pulse applied to the input terminal 14 of the bistable circuit may be supplied from a monostable circuit of the type illustrated in the box 24. The negative reset pulse applied to the reset terminal 18 of the bistable circuit may be derived from a positive pulse by means of any suitable inverter circuit.

Figures 3, 4:
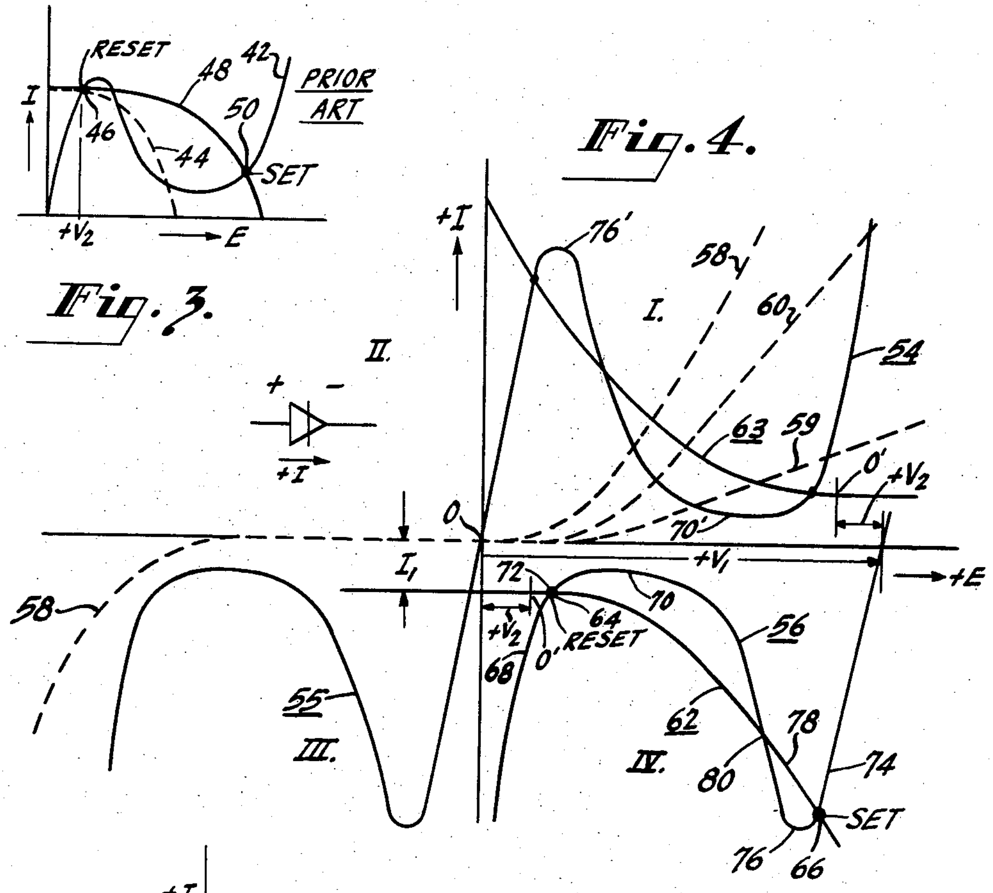
FIGURE 3 is a current-voltage chart which will be referred to in describing prior art arrangements.
FIGURE 4 is a current-voltage chart which will be referred to in explaining the construction and operation of the circuit of FIGURE 1.

The operation of the monostable "and" gate 24 will now be briefly described with references to the characteristic chart of FIGURE 3. The current-voltage characteristic of the tunnel diode 32 is represented by the curve 42. The non-linear load line presented to the tunnel diode 32 by the circuit elements 33, 34, 35 and 36 is as represented by the dashed curve 44. The current source 33 has the effect of causing the non-linear load line 44 to be located with relation to the tunnel diode characteristic 42, so that there is a stable operating point 46 at the positive-resistance side of the narrow high-current peak of the tunnel diode characteristic 42.

In the operation of the monostable "and" gate 24, the simultaneous occurrence of an input pulse at input terminal 37 and a positive input level at input terminal 40 causes the operating point 46 of the tunnel diode 32 to go over the current peak, switch rapidly to the high-voltage positive-resistance region of the characteristic 42 and then return downwardly and to the left on its way back to the stable operating point 46. The described switching of the monostable tunnel diode 32 results in the generation of a positive output pulse having a duration determined primarily by the inductor 36. When the operating point of the tunnel diode 32 is at its stable point 46, which is its normal condition, the voltage $+V_2$ at the junction point 41 is fixed at a given value such as 70 millivolts. This value is determined by the voltage of the stable operating point 46 on the characteristic of the tunnel diode 32.

Having referred to FIGURE 3 in connection with the operation of a known monostable circuit, reference will now be made again to FIGURE 3 for a description of a known bistable tunnel diode circuit. A known bistable circuit may have a circuit configuration similar to the monostable circuit 24, but having a different value for the voltage at the voltage source terminal 34 so that the load line presented to the tunnel diode is disposed as shown by the load line 48 in FIGURE 3. The circuit then has a stable operating point intersection 46 and also an additional stable operating point 50.

Such a known bistable circuit has one stable operating point 46 formed by the intersection of the high-impedance (horizontal) portion of the load characteristic 48 and the positive-resistance side of the high-current peak of the tunnel diode characteristic 42. There is a second stable operating point 50 formed by the intersection of the load characteristic 48 with the positive-resistance, low-current portion of the broad-valley portion of the tunnel diode characteristic 42. The operating point is switched from the operating point 46 to the operating point 50 by applying a positive input signal to the tunnel diode which may be viewed as causing the load line 48 to rise above the current peak of the tunnel diode characteristic 42. The operating point is switched from the point 50 to the point 46 by applying a negative pulse to the tunnel diode which may be viewed as lowering the load characteristic 48 until there is no intersection with the positive-impedance side of the valley portion of the tunnel diode characteristic 42. It can be seen from FIGURE 3 that a relatively small positive input pulse is required to cause switching from operating point 46 and that a relatively large negative input pulse is required to cause switching from the operating point 50. Stated another way, the circuit is more easily set to the set operating point 50 than it is reset to the reset operating point 46.

The bistable circuit of FIGURE 1 according to this present invention is different from the above-described previously known bistable circuit in that the polarity of the bistable tunnel diode 10 is reversed, and in that an additional positive constant-voltage bias source having a $+V$ terminal is connected to the anode of the tunnel diode 10.

The current-voltage characteristics at the two terminals of an unbiased tunnel diode are customarily shown as a characteristic 54 existing in the quadrant I of a current-voltage chart as shown in FIGURE 4. In this chart, positive current flow is upward and positive voltage is to the right. When the tunnel diode is reversed in polarity to have the polarity of the diode 10 in FIGURE 1, the characteristic of the tunnel diode is as shown by the curve 55 in quadrant III of the chart. The affect of the $+V_1$ voltage applied to the anode of tunnel diode 10 is to shift the tunnel diode characteristic to the right by the amount $+V_1$ so that the characteristic occupies the position in quadrant IV as shown by the curve 56. The tunnel diode current peak 76′ and current valley 70′ of curve 54 in quadrant I give rise to the generally accepted meanings of the terms "$_3$peak" and "valley" which will be followed in identifying the corresponding peak 76 and valley 70 of the inverted curve 56 in quadrant IV.

One of the tunnel rectifiers 25, 26 or 27 in FIGURE 1 has a two-terminal device characteristic as shown by the dashed line 58 in FIGURE 4. The portion of one tunnel rectifier characteristic in quadrant unit I when considered in combination with its respective associated series impedance 28, 29 or 30 has a characteristic as shown by the dashed line 59. The characteristics of all three parallel-connected sets of tunnel rectifiers 25, 26 and 27 and associated series impedances 28, 29 and 30 have a current-voltage characteristic as represented by the dashed line 60. Since the rectifiers and impedances constitute a load on the tunnel diode 10, the characteristic 60 is inverted to show it as a load line 62 on the characteristic 56 of the tunnel diode 10. The load line 62 is not only an inverted version of characteristic 60, but it is also a version (1) having its origin O′ shifted to the right by an amount $+V_2$ corresponding to the voltage $+V_2$ existing at the input terminals 40 and the junction points 41 of the monostable circuits 22, 23 and 24, and it is a version (2) having its origin O′ moved downwardly an amount $I_1$ due to the constant current source $I_1$. The load line 62 in quadrant IV is the load characteristic effectively presented to the tunnel diode 10.

The tunnel diode characteristic 56 and the load characteristic 62 in FIGURE 4 have two stable operating point intersections: a reset operating point 64 and a set operating point 66. The reset operating point 64 is at the intersection of the positive-resistance side 68 of the broad current valley portion 70 of the bistable tunnel diode characteristic 56 and the low-current high-impedance portion 72 of the load characteristic 62. The set operating point 66 is at the intersection of the positive-resistance side 74 of the narrow current peak portion 76 of the tunnel diode characteristic 56 and the high-current intermediate-impedance portion 78 of the load characteristic 62. The intersection of the load-impedance characteristic 62 with the negative-resistance portion of the tunnel diode characteristic 56 at 80 is an unstable point which can be ignored in considering the operation of the circuit.

When a positive input pulse is applied to the set terminal 14 of the circuit of FIGURE 1, the effect of the positive input pulse may be viewed as causing the load line 62 to move upwardly until there is no intersection of the load line 62 with the positive-resistance side 68 of the valley portion 70 of the tunnel diode characteristic 56. When this occurs, the operating point 64 rapidly switches to the right to the positive-resistance side 74 of the current peak 76 of the tunnel diode characteristic 56. The operating point stabilizes at the set operating point 66. When a negative reset pulse is applied to the input terminal 18 of the circuit of FIGURE 1, the negative input pulse may be viewed as causing a downward movement of the load characteristic 62 until there is no intersection of the load characteristic 62 with the positive-resistance side 74 of the current peak 76 of the tunnel diode characteristic 56. The operating point 66 then rapidly switches to the left until the positive-resistance side 68 of the tunnel diode characteristic 56 is encountered. The operating point then stabilizes at the reset operating point 64.

Because of the fact that the valley portion 70 of the tunnel diode characteristic 56 is so broad (compared with the current-peak portion), it requires a relatively large input signal to move a load characteristic over the valley 70. The present invention minimizes the positive input set current pulse required for switching, by virtue of the fact that the load characteristic 62 presents a very large impedance in the portion 72 of its characteristic that forms the operating point 64. This means that all of the positive input pulse applied to the junction point 12 in FIGURE 1 flows into the tunnel diode 10 to cause it to switch. Substantially none of the input pulse is able to pass over the lead 13 to the load because of the very high impedance presented by the load. Also, the positive input pulse cannot flow into the current source $I_1$ because the source is a constant current source. Therefore, the constant current characteristic of the load at the operating point 64 reduces the input current required to switch the operating point over the broad valley portion 70 of the tunnel diode characteristic 56.

In the resetting of the operating point from the set operating point 66 to the reset operating point 64, the negative input pulse sees the intermediate-impedance portion 78 of the load characteristic 62. Therefore, some of the negative input pulse is diverted from the tunnel diode 10 over the lead 13 to the load. However, the relatively narrow current peak portion 76 of the tunnel diode characteristic 56 makes it relatively easy for the operating point to be switched from the point 66 over the peak 76.

To summarize the foregoing, the circuit arrangement according to the invention is one wherein the high impedance portion of the load characteristic is associated with the broad valley portion of the tunnel diode characteristic, and the intermediate-impedance portion of the load characteristic is associated with the narrow current peak portion of the tunnel diode characteristic. By this arrangement, both the positive set pulse and the negative reset pulse need be only about 10 milliamperes in current amplitude when using circuit elements having the values noted by way of example, on FIGURE 1 of the drawing. This is to be contrasted with prior art arrangements wherein 30 or more milliamperes of resetting current is required. The invention uses the tunnel diode and load characteristics in a complementary fashion to minimize and equalize the input setting and resetting current requirements.

The invention provides for easy resetting without the necessity of including inductance for the purpose of limiting diversion of the input reset signal to the load, as is done in some prior art circuits. The elimination of the inductance reduces signal delay and permits the output of the bistable circuit to be effective in switching the utilization circuits in a shorter time than is possible when inductance is included. Therefore, the circuit of the invention is capable of faster operation. The bistable circuit is also capable of a higher repetition rate with a given amplitude of reset input pulses because less input driving current is required for resetting the bistable circuit, and any excess input amplitude constitutes overdrive which speeds up the resetting.

The operation of the circuit of FIGURE 1 has been described by references to the tunnel diode characteristic 56 and the load characteristic 62 existing in quadrant IV in the chart of FIGURE 4. The operation of the circuit can also be understood from the relationship of the tunnel diode characteristic 54 and the load characteristic 63 in quadrant I in the chart of FIGURE 4. The quadrant in which the curves are drawn is determined by the assumed polarities of currents and voltages in the circuit of FIGURE 1. The important consideration is the relative relationship of the tunnel diode characteristic and the load characteristic.

Figure 2:
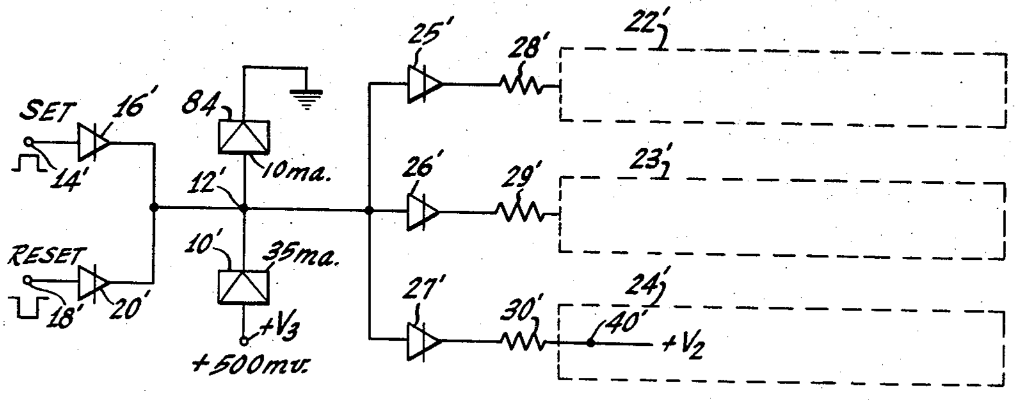
FIGURE 2 is a diagram illustrating another embodiment of the invention wherein an additional tunnel diode replaces a current source in the circuit of FIGURE 1.

FIGURE 2 shows a bistable circuit according to the invention which differs from the embodiment of FIGURE 1 in that an additional tunnel diode 84 is employed in place of the current source $I_1$ in FIGURE 1. All the other circuit elements in FIGURE 1 bear the same reference numerals as corresponding elements in FIGURE 1, with prime designations added. The additional tunnel diode 84 is connected with relation to the tunnel diode 10' in such a way as to present at the junction point 12' a composite tunnel diode characteristic. In achieving the purposes of the present invention, the tunnel diode 84 may have a lower peak current than the tunnel diode 10'. Tunnel diode 84 may have a peak current of 10 milliamperes and tunnel diode 10' may have a peak current of 35 milliamperes, according to the example illustrated in FIGURE 2.

Figure 5:
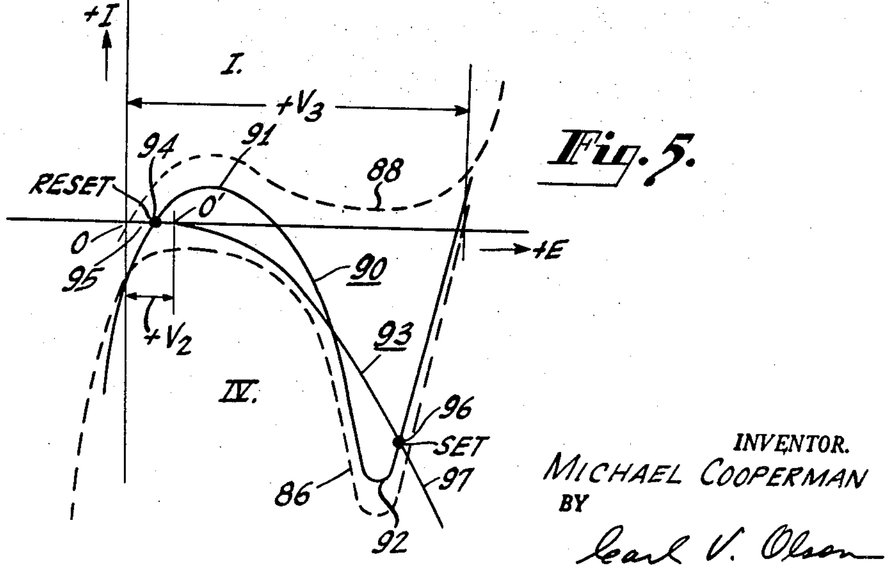
FIGURE 5 is a current-voltage chart which will be referred to in describing the operation of the circuit of FIGURE 2.

FIGURE 5 is a current-voltage characteristic chart illustrating the characteristic 86 of the tunnel diode 10' in the circuit of FIGURE 2. The characteristic 86 is in quadrant IV and has a zero current point which is shifted by the amount $+V_3$ from the origin of the chart. The voltage $+V_3$ may be, for example, 500 millivolts. The additional tunnel diode 84 has a characteristic 88 in the usual quadrant IV because its cathode is returned to ground. The composite characteristic presented between junction point 12' and ground by the two tunnel diodes 10' and 84 is shown by the curve 90 in FIGURE 5. The composite characteristic 90 is derived by adding the characteristics 86 and 88 in the current direction, since the two tunnel diodes are effectively in parallel between junction point 12' and ground. The composite characteristic 90 has a low current valley portion 91 which extends above the zero current axis in the chart, and has a high-current peak 92 below the zero current axis. Since the low-current valley 91 is offset from the zero current axis, the desired relationship between the tunnel diode characteristic 90 and the load characteristic 93 is achieved without the use of the current source $I_1$ of FIGURE 1. The load characteristic 93 has its origin O' shifted to the right (from where it would otherwise be) by the voltage $+V_2$ existing at the level input terminals 40' in the monostable "and" gate circuits 22', 23' and 24'. The load may be designed to provide an appropriate characteristic 93 which is somewhat different in shape from the load characteristic 62 in FIGURE 4.

In FIGURE 5, the reset stable operating point 94 is at the intersection of the positive-resistance side of the current valley portion 91 of the composite characteristic 90 of the tunnel diodes and the low-current (zero current) high-impedance portion 95 of the load characteristic 93. The set operating point 96 is at the intersection of the positive resistance side of the current peak portion 92 of the composite characteristic 90 of the tunnel diodes and the high-current intermediate-impedance 97 of the load characteristic 93.

The operation of the circuit of FIGURE 2 is the same as has been previously described in connection with the circuit of FIGURE 1. The circuit of FIGURE 2 has an additional advantage in that the use of the additional tunnel diode 84 may be more convenient, stable and economical than the use of the current source $I_1$. The circuit of FIGURE 2 has the additional advantage that, by the appropriate selection of the characteristics of the two tunnel diodes 10' and 84, and the bias voltage $+V_3$, the valley portion 91 of the composite characteristic 90 may be made narrower than the valley portion of an individual tunnel diode. This makes the switching of the operating point from the reset point 94 to the set point 96 somewhat easier, so that an even lower amplitude input set pulse is adequate.

It is thus apparent that, according to this invention, there is provided an improved bistable tunnel diode circuit wherein the bistable tunnel diode characteristic is related to the non-linear characteristic of its load so that the characteristics complement each other in tending to minimize and tending to equalize the current requirements of the input set and reset current pulse signals.

What is claimed is:

1. The combination comprising
a negative resistance device having a current-voltage characteristic including a high-current peak having a positive resistance side, an intermediate negative resistance region and a low-current valley having a positive resistance side,
a utilization circuit,
a non-linear impedance device coupled from said negative resistance device to said utilization circuit,
said coupling device and utilization circuit presenting a current-voltage load characteristic to said negative resistance device which includes a constant-current high-impedance portion,
and means to bias said negative resistance device and non-linear impedance device to provide a stable operating point intersection of the positive resistance side of the current valley portion of the negative resistance device characteristic and the constant-current high-impedance portion of the load characteristic.

2. A bistable circuit comprising
a bistable tunnel diode having a current-voltage characteristic including a narrow high-current peak having a positive resistance side and a broad low-current valley having a positive resistance side,
a utilization circuit,
a tunnel rectifier coupled from said bistable tunnel diode to said utilization circuit,
said tunnel rectifier and utilization circuit presenting a current-voltage load characteristic to said tunnel diode which includes a low-current high-impedance portion,
and means to bias said bistable tunnel diode and tunnel rectifier to provide a stable operating point intersection of the positive resistance side of the current valley portion of the bistable tunnel diode characteristic and the low-current high-impedance portion of the load characteristic.

3. A bistable circuit comprising
a bistable tunnel diode having a current-voltage characteristic including a narrow high-current peak having a positive resistance side and a broad low-current valley having a positive resistance side,
a utilization circuit,
a tunnel rectifier coupled from said bistable tunnel diode to said utilization circuit,
said tunnel rectifier and utilization circuit presenting a current-voltage load characteristic to said tunnel diode which includes a low-current high-impedance portion and a high-current lower-impedance portion,
and means to bias said bistable tunnel diode and tunnel rectifiers to provide a first stable operating point intersection of the positive resistance side of the current valley portion of the bistable tunnel diode characteristic and the low-current high-impedance portion of the load charactertistic, and to provide a second stable operating point intersection of the positive re-resistance side of the current peak portion of the bistable tunnel diode characteristic and the high-current lower-impedance portion of the load characteristic.

4. A bistable circuit comprising
a bistable tunnel diode having a current-voltage characteristic including a narrow high-current peak having a positive resistance side and a broad low-current valley having a positive resistance side,
a plurality of tunnel diode utilization circuits each having an input terminal normally maintained at a fixed voltage,
an equal plurality of tunnel rectifiers coupled from said bistable tunnel diode to respective input terminals of said utilization circuits,
said tunnel rectifiers and utilization circuits presenting a current-voltage load characteristic to said tunnel diode which includes a low-current high-impedance portion,
and means to bias said bistable tunnel diode and tunnel rectifiers to provide a stable operating point intersection of the positive resistance side of the current valley portion of the bistable tunnel diode characteristic and the low-current high-impedance portion of the load characteristic.

5. A bistable circuit comprising
a bistable tunnel diode having a current-voltage characteristic including a narrow high-current peak having a positive resistance side and a broad low-current valley having a positive resistance side,
a plurality of monostable tunnel diode "and" gate utilization circuits each having an input terminal normally maintained at a fixed voltage,
an equal plurality of tunnel rectifiers coupled from said bistable tunnel diode to respective input terminals of said utilization circuits,
said tunnel rectifiers and utilization circuits presenting a current-voltage load characteristic to said tunnel diode which includes a low-current high-impedance portion and a high-current lower-impedance portion,
and means to apply current and voltage biases to said bistable tunnel diode and tunnel rectifiers to provide a first stable operating point intersection of the positive resistance side of the current valley portion of the bistable tunnel diode characteristic and the low-current high-impedance portion of the load characteristic, and to provide a second stable operating point intersection of the positive resistance side of the current peak portion of the bistable tunnel diode characteristic and the high-current lower-impedance portion of the load characteristic.

6. A bistable circuit comprising
first and second bistable tunnel diodes connected together to provide a composite current-voltage characteristic including a high-current peak having a positive resistance side and a low-current valley having a positive resistance side,
a tunnel diode utilization circuit,
a tunnel rectifier coupled from said bistable tunnel diodes to said utilization circuit,
said tunnel rectifier and utilization circuit presenting a current-voltage load characteristic to said bistable tunnel diodes which includes a low-current high-impedance portion,
and means to bias said bistable tunnel diodes and tunnel rectifier to provide a stable operating point intersection of the positive resistance side of the current valley portion of the bistable tunnel diodes composite characteristic and the low-current high-impedance portion of the load characteristic.

7. A bistable circuit comprising
first and second bistable tunnel diodes connected together to provide a composite current-voltage characteristic including a high-current peak having a positive resistance side and a low-current valley having a positive resistance side,
a utilization circuit, a tunnel rectifier coupled from said bistable tunnel diodes to said utilization circuit,
said tunnel rectifier and utilization circuit presenting a current-voltage load characteristic to said bistable tunnel diodes which includes a low-current high-impedance portion and a high-current lower-impedance portion,
and means to bias said bistable tunnel diodes and tunnel rectifiers to provide a first stable operating point intersection of the positive resistance side of the current valley portion of the bistable tunnel diodes composite characteristic and the low-current high-impedance portion of the load characteristic, and to provide a second stable operating point intersection of the positive resistance side of the current peak portion of the bistable tunnel diodes composite characteristic and the high-current lower-impedance portion of the load characteristic.

8. A bistable circuit comprising
first and second bistable tunnel diodes connected together to provide a composite current-voltage characteristic including a high-current peak having a positive resistance side and a low-current valley having a positive resistance side,
a plurality of tunnel diode utilization circuits,
an equal plurality of tunnel rectifiers coupled from said bistable tunnel diodes to said utilization circuits,
said tunnel rectifiers and utilization circuits presenting a current-voltage load characteristic to said bistable tunnel diodes which includes a low-current high-impedance portion and a high-current lower-impedance portion,
and means to apply a voltage bias to said bistable tunnel diodes and tunnel rectifiers to provide a first stable operating point intersection of the positive resistance side of the current valley portion of the bistable tunnel diodes composite characteristic and the low-current high-impedance portion of the load characteristic, and to provide a second stable operating point intersection of the positive resistance side of the current peak portion of the bistable tunnel diodes composite characteristics and the high-current lower-impedance portion of the load characteristic.

9. A bistable circuit comprising
first and second bistable tunnel diodes connected together to provide a composite current-voltage characteristic including a narrow high-current peak having a positive resistance side and a broad low-current valley having a positive resistance side,
a plurality of monostable tunnel diode "and" gate utilization circuits each having an input terminal normally maintained at a fixed voltage,
an equal plurality of tunnel rectifiers coupled from said bistable tunnel diodes to respective input terminals of said utilization circuits,
said tunnel rectifiers and utilization circuits presenting a current-voltage load characteristic to said bistable tunnel diodes which includes a low-current high-impedance portion and a high-current lower-impedance portion,
and means to apply a voltage bias to said bistable tunnel diodes and tunnel rectifiers to provide a first stable operating point intersection of the positive resistance side of the current valley portion of the bistable tunnel diodes composite characteristic and the low-current high-impedance portion of the load characteristic, and to provide a second stable operating point intersection of the positive resistance side of the current peak portion of the bistable tunnel diodes composite characteristic and the high-current lower-impedance portion of the load characteristic.

References Cited in the file of this patent

General Electric's Tunnel Diode Manual, by H. R. Lowry et al., First Edition, March 1961 (page 59, FIG 6.3 relied upon).